(12) United States Patent
Kanai

(10) Patent No.: US 11,735,450 B2
(45) Date of Patent: Aug. 22, 2023

(54) SUBSTRATE STORAGE CONTAINER

(71) Applicant: Shin-Etsu Polymer Co., Ltd., Tokyo (JP)

(72) Inventor: Sou Kanai, Saitama (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 0 days.

(21) Appl. No.: 17/637,870

(22) PCT Filed: Jul. 10, 2020

(86) PCT No.: PCT/JP2020/027132
§ 371 (c)(1),
(2) Date: Feb. 24, 2022

(87) PCT Pub. No.: WO2021/039153
PCT Pub. Date: Mar. 4, 2021

(65) Prior Publication Data
US 2022/0277977 A1    Sep. 1, 2022

(30) Foreign Application Priority Data

Aug. 27, 2019 (JP) ................................. 2019-154371

(51) Int. Cl.
*H01L 21/673* (2006.01)

(52) U.S. Cl.
CPC .. *H01L 21/67386* (2013.01); *H01L 21/67369* (2013.01); *H01L 21/67383* (2013.01)

(58) Field of Classification Search
CPC ........... H01L 21/67383; H01L 21/6732; H01L 21/67303; H01L 21/303; H01L 21/67369; H01L 21/67386

USPC ......................................... 206/832, 710–711
See application file for complete search history.

(56) References Cited

U.S. PATENT DOCUMENTS

| | | | | |
|---|---|---|---|---|
| 5,228,568 A | * | 7/1993 | Ogino | H01L 21/67369 206/711 |
| 7,017,749 B2 | * | 3/2006 | Yajima | H01L 21/67369 211/41.18 |
| 10,217,655 B2 | * | 2/2019 | Mushel | H01L 21/67373 |
| 10,559,484 B2 | * | 2/2020 | Kato | H01L 21/67369 |
| 11,101,155 B2 | * | 8/2021 | Sato | H01L 21/67379 |

(Continued)

FOREIGN PATENT DOCUMENTS

| JP | WO2009060782 A1 | 5/2009 |
|---|---|---|
| JP | 2016149492 A | 8/2016 |

(Continued)

*Primary Examiner* — Chun Hoi Cheung
(74) *Attorney, Agent, or Firm* — The Webb Law Firm

(57) ABSTRACT

A substrate storage container includes: a container body configured to store a substrate; a lid configured to close an opening formed on the front side of the container body; and a retainer arranged on the back of the lid and configured to restrict the substrate from moving to the front side. The retainer includes an integration of: a frame configured to be detachably attached to the back of the lid; a contact portion including a convex portion configured to contact the substrate and restrict the substrate from moving to the front side; and a beam structure that connects the frame and the contact portion. The contact portion and the beam structure are configured to be spaced apart from the lid.

7 Claims, 14 Drawing Sheets

(56) References Cited

U.S. PATENT DOCUMENTS

| | | | |
|---|---|---|---|
| 2003/0132133 A1* | 7/2003 | Cheesman | H01L 21/67369 |
| | | | 206/711 |
| 2010/0258475 A1 | 10/2010 | Ogawa | |
| 2014/0197068 A1* | 7/2014 | Cho | H01L 21/67383 |
| | | | 206/711 |
| 2015/0068949 A1* | 3/2015 | Raschke | H01L 21/67386 |
| | | | 206/711 |
| 2018/0068882 A1 | 3/2018 | Kato et al. | |

FOREIGN PATENT DOCUMENTS

| | | |
|---|---|---|
| JP | WO2016163166 A1 | 10/2016 |
| JP | 2016189373 A | 11/2016 |
| JP | 2017147365 A | 8/2017 |

* cited by examiner

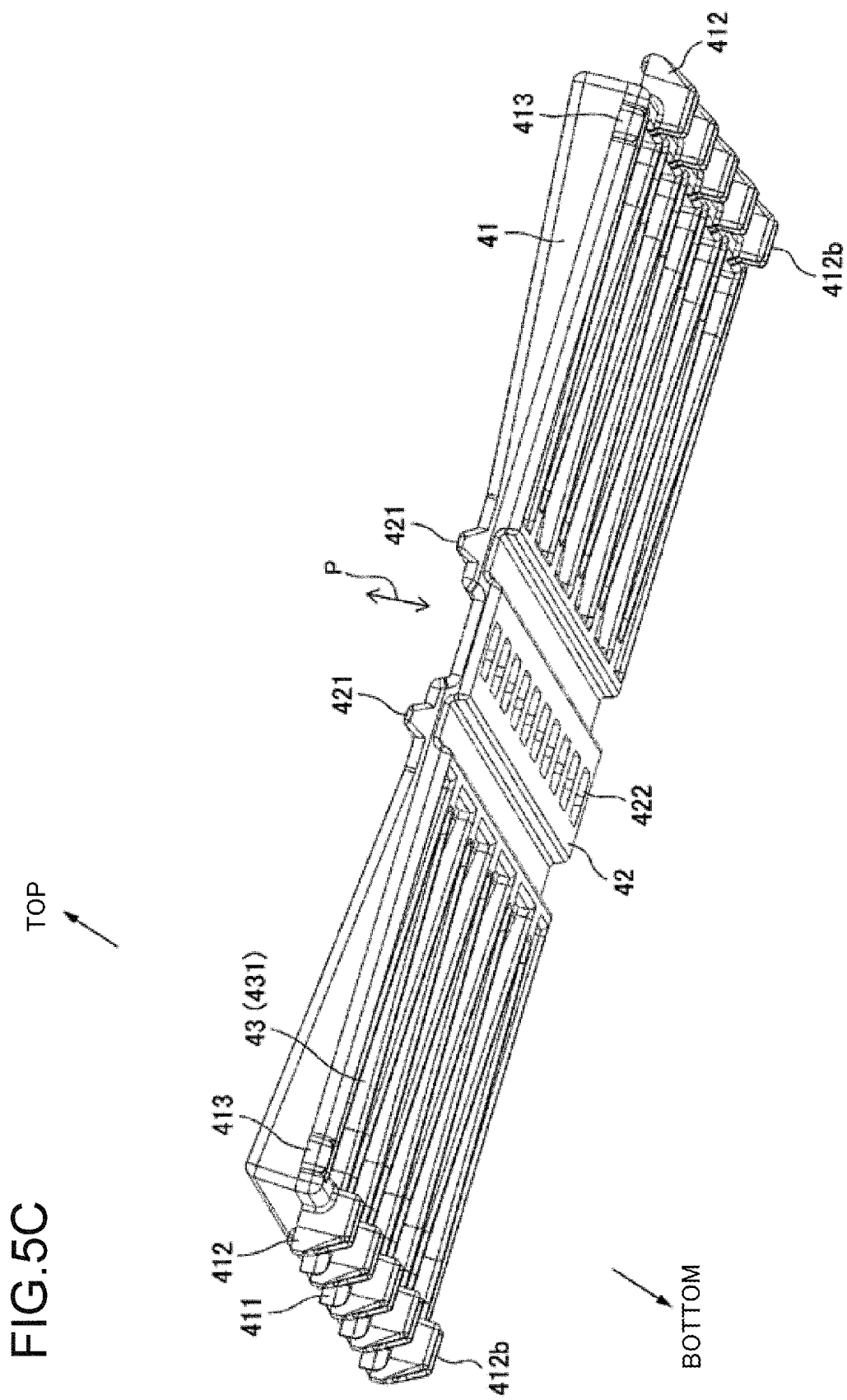

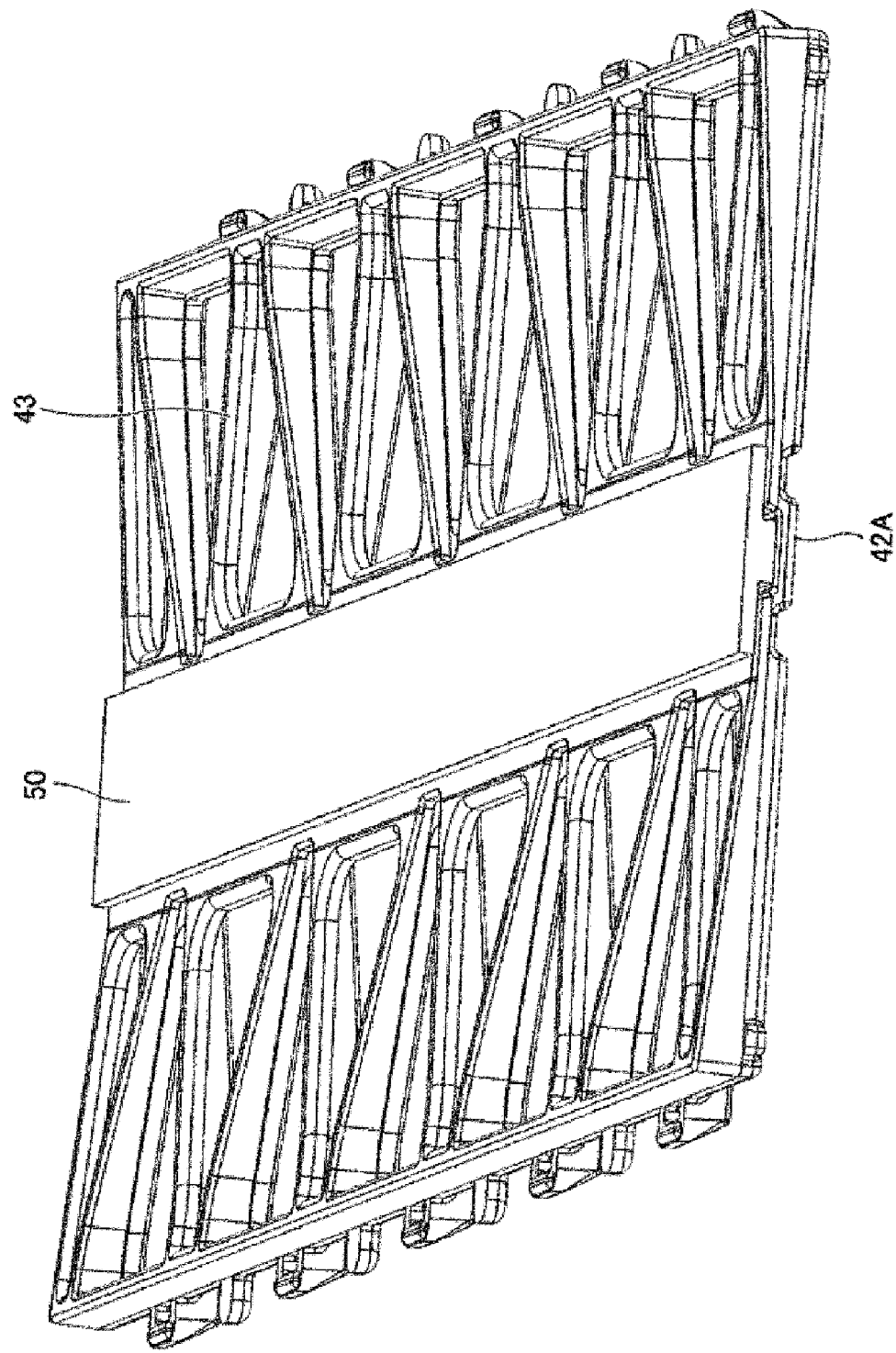

SUBSTRATE STORAGE CONTAINER

CROSS-REFERENCE TO RELATED APPLICATIONS

This application is the United States national phase of International Application No. PCT/JP2020/027132 filed Jul. 10, 2020, and claims priority to Japanese Patent Application No. 2019-154371 filed Aug. 27, 2019, the disclosures of which are hereby incorporated by reference in their entirety.

BACKGROUND OF THE INVENTION

Field of the Invention

The present invention relates to a substrate storage container for storing substrates.

Description of Related Art

A substrate storage container is a holder of substrates such as semiconductor wafers used for storage in a warehouse as well as for transportation between semiconductor processing units or between factories. A substrate storage container generally has an opening on its front side to place substrates in and take them out, and a removable lid to seal the opening. Such a substrate storage container is provided with a retainer on the back of the lid (inside the substrate storage container) to restrict substrates stored therein from moving toward the opening.

PRIOR ART DOCUMENT

Patent Document

Patent Document 1: International Publication No. WO 2009/60782

The conventional retainer supports substrates using engagement portions each formed at a position corresponding to the height at which each of the substrates is located in the substrate storage container. However, thin wafers and glass substrates, which have come into use in recent years, are more flexible and bend larger than regular ones, and they may not be able to stay appropriately engaged with their respective engagement portions. Due to this, there is a need for a retainer with a structure that can effectively absorb the bending of substrates to stabilize the holding of the substrates. In addition, it is required to change the shape and size of the engagement portions of the retainer to store a substrate that is thicker than a regular one or a substrate that is composed of multiple substrates stacked together. Therefore, the retainer needs to be designed according to the thickness of substrates.

SUMMARY OF THE INVENTION

It is an object of the present invention to provide a substrate storage container with a retainer that can effectively absorb the bending of substrates and accommodate differences in the thickness of the substrates.

According to one aspect, a substrate storage container comprises: a container body configured to store substrates; a lid configured to close an opening formed on the front side of the container body; and a retainer arranged on the back of the lid and configured to restrict the substrates from moving to the front side. The retainer comprises an integration of: a frame configured to be detachably attached to the back of the lid; a contact portion including a convex portion configured to contact the substrates and restrict the substrates from moving to the front side; and a beam structure that connects the frame and the contact portion. The contact portion and the beam structure are configured to be spaced apart from the lid.

According to the aspect of the present invention, the retainer can effectively absorb the bending of substrates and accommodate differences in the thickness of the substrates.

BRIEF DESCRIPTION OF THE DRAWINGS

FIG. 5C is a perspective view of the retainer.

FIG. 8A is a perspective view illustrating an example in which a detachable separate member is attached to a contact portion.

DESCRIPTION OF THE INVENTION

Exemplary embodiments will hereinafter be described with reference to the accompanying drawings.

Figure 1:
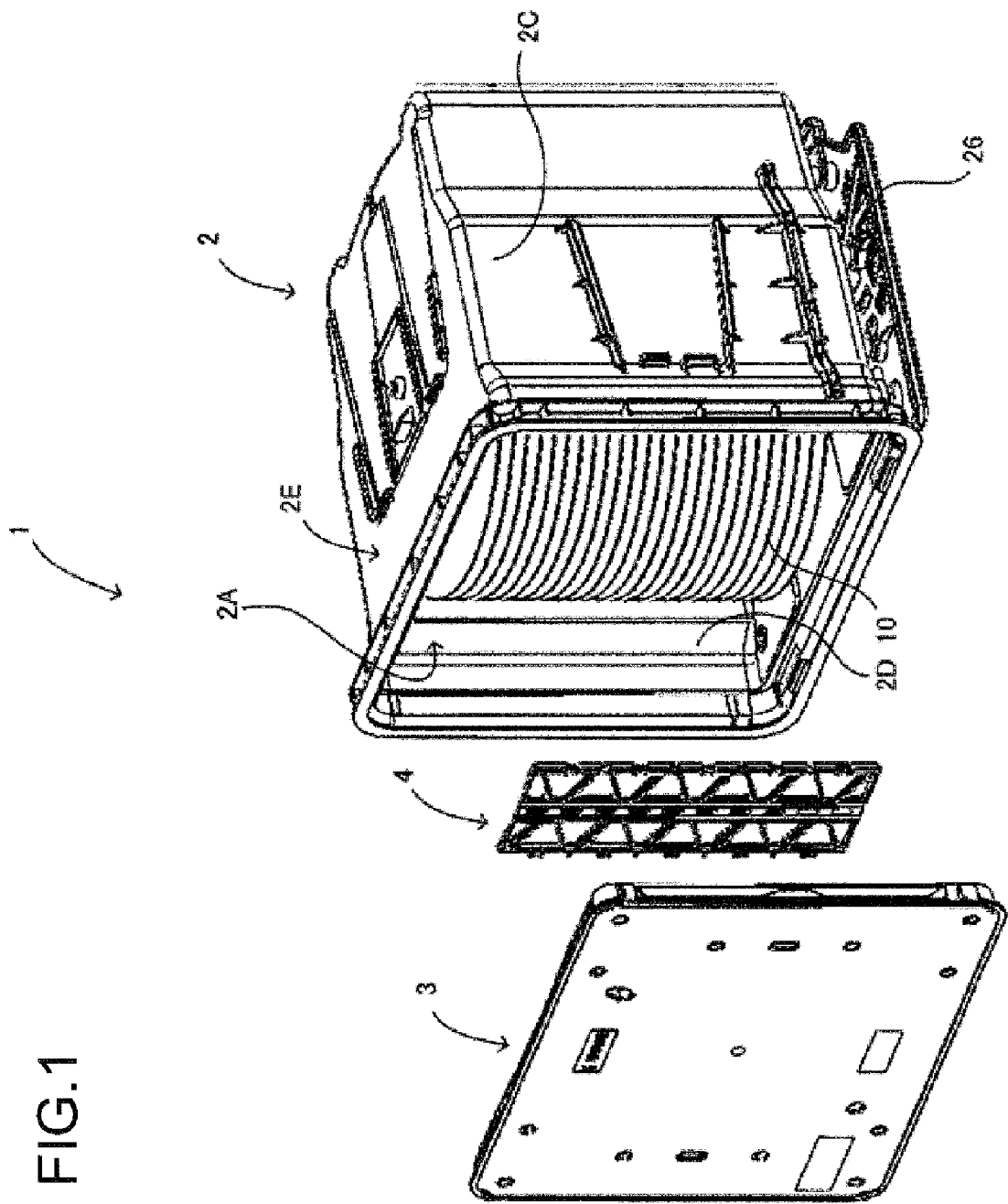
FIG. 1 is an exploded perspective view of a substrate storage container according to an embodiment.
Figure 2:
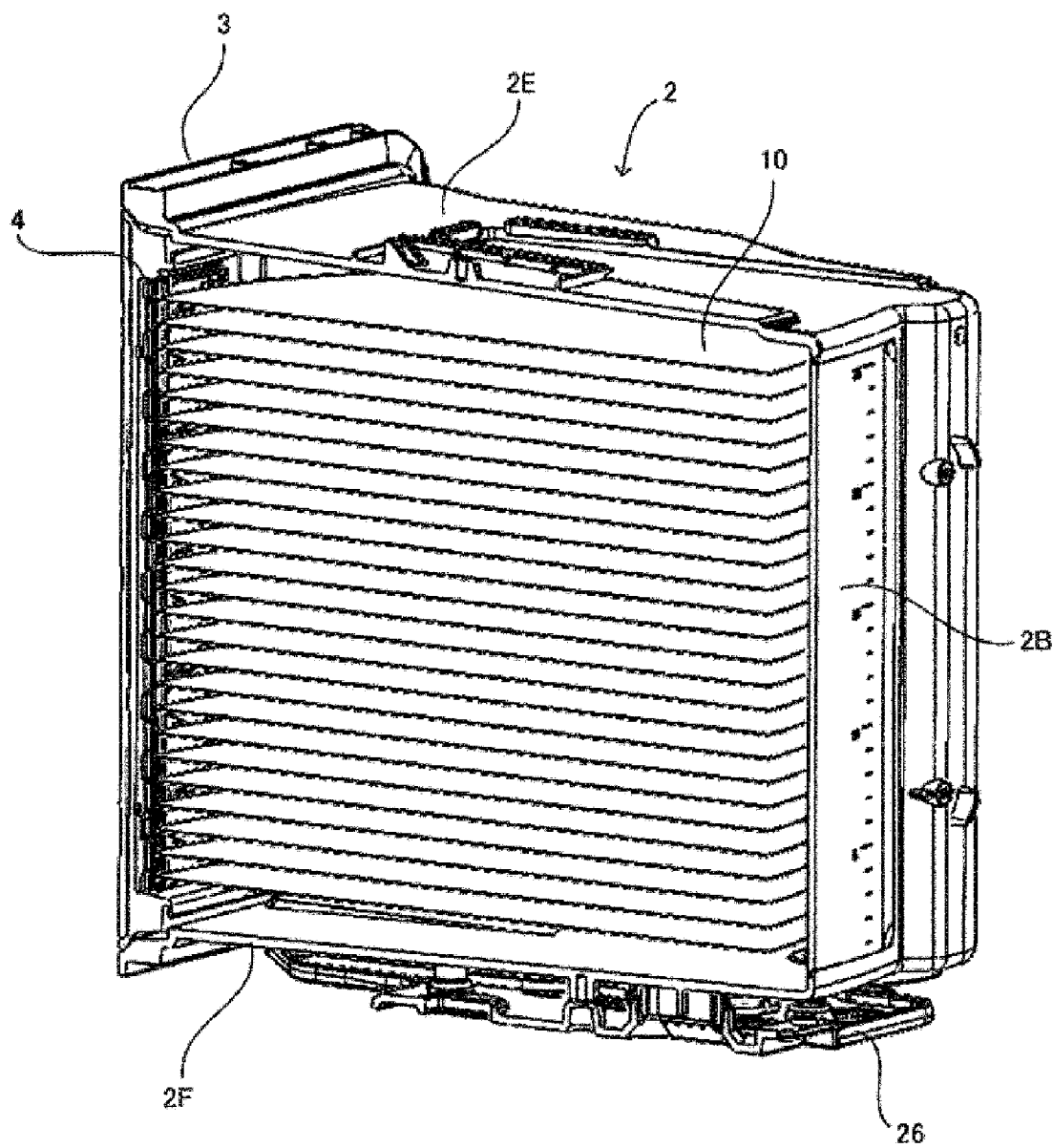
FIG. 2 is a cross-sectional perspective view of the substrate storage container.

FIG. 1 is an exploded perspective view of a substrate storage container according to an embodiment. FIG. 2 is a cross-sectional perspective view of the substrate storage container.

As illustrated in FIGS. 1 and 2, a substrate storage container 1 includes a container body 2 configured to store a plurality of substrates 10 and a lid 3 configured to be detachably attached to the container body 2. While the substrate storage container 1 can store any type of substrates, the substrates 10 may be, for example, semiconductor wafers or mask glass substrates with a diameter of 300 mm or 450 mm. The substrate storage container 1 may have a capacity of, for example, up to 25 substrates; however, there may be any number of substrates (10) stored therein.

As illustrated in FIGS. 1 and 2, the container body 2 has an opening 2A (FIG. 1) on its front side to place the substrates 10 in and take them out. The lid 3 is attached to the opening 2A and keeps the substrate storage container 1 airtight.

The container body 2 has a rear wall 2B (FIG. 2), a right wall 2C (FIG. 1), a left wall 2D (FIG. 1), a top surface 2E, and a bottom surface 2F (FIG. 2), i.e., it has walls on all sides except the front side. The substrate storage container 1 is substantially rectangular parallelepiped in shape when the lid 3 is attached to the opening 2A of the container body 2. The substrate storage container 1 is a type of container called a front open box that has an opening (2A) in the front. Hereinafter, the face where the opening 2A is located is referred to as "front face", and the face where the rear wall 2B is located is referred to as "rear face". The left-right direction as viewed from the front face side (front side) is referred to as "lateral direction" or "horizontal direction", and the top-bottom direction with respect to the substrates 10 stored horizontally is referred to as "longitudinal direction" or "vertical direction".

The container body 2 is provided therein with a plurality of support pieces (not illustrated) that are attached to the right wall 2C and the left wall 2D. The number of the support pieces corresponds to the maximum number of the substrates 10 that can be stored in the substrate storage container 1. The support pieces are arranged at equal intervals in the vertical direction on the right wall 2C and the left wall 2D. A pair of left and right support pieces at the same height support the same one of the substrates 10 from both sides such that the substrates 10 are stored horizontally in the container body 2.

A bottom plate 26 can be attached to the bottom surface 2F of the container body 2 for positioning the container body 2 that is placed in a predetermined position. The container body 2, the lid 3, and the bottom plate 26 are formed by injection molding of material(s) containing resin. Examples of the resin contained in the molding material include thermoplastic resins such as polycarbonates, cycloolefin polymers, polyetherimides, polyetherketones, polybutylene terephthalates, polyacetals, and liquid crystal polymers, and alloys thereof.

The resin may contain a conductive material and an antistatic agent as necessary; the conductive material may be, for example, carbon fiber, carbon powder, carbon nanotube, or conductive polymer, and the antistatic agent may be anionic, cationic or nonionic. The resin may further contain an ultraviolet absorber, reinforcing fiber such as glass fiber and carbon fiber to improve the rigidity, and the like if needed.

Figure 3:
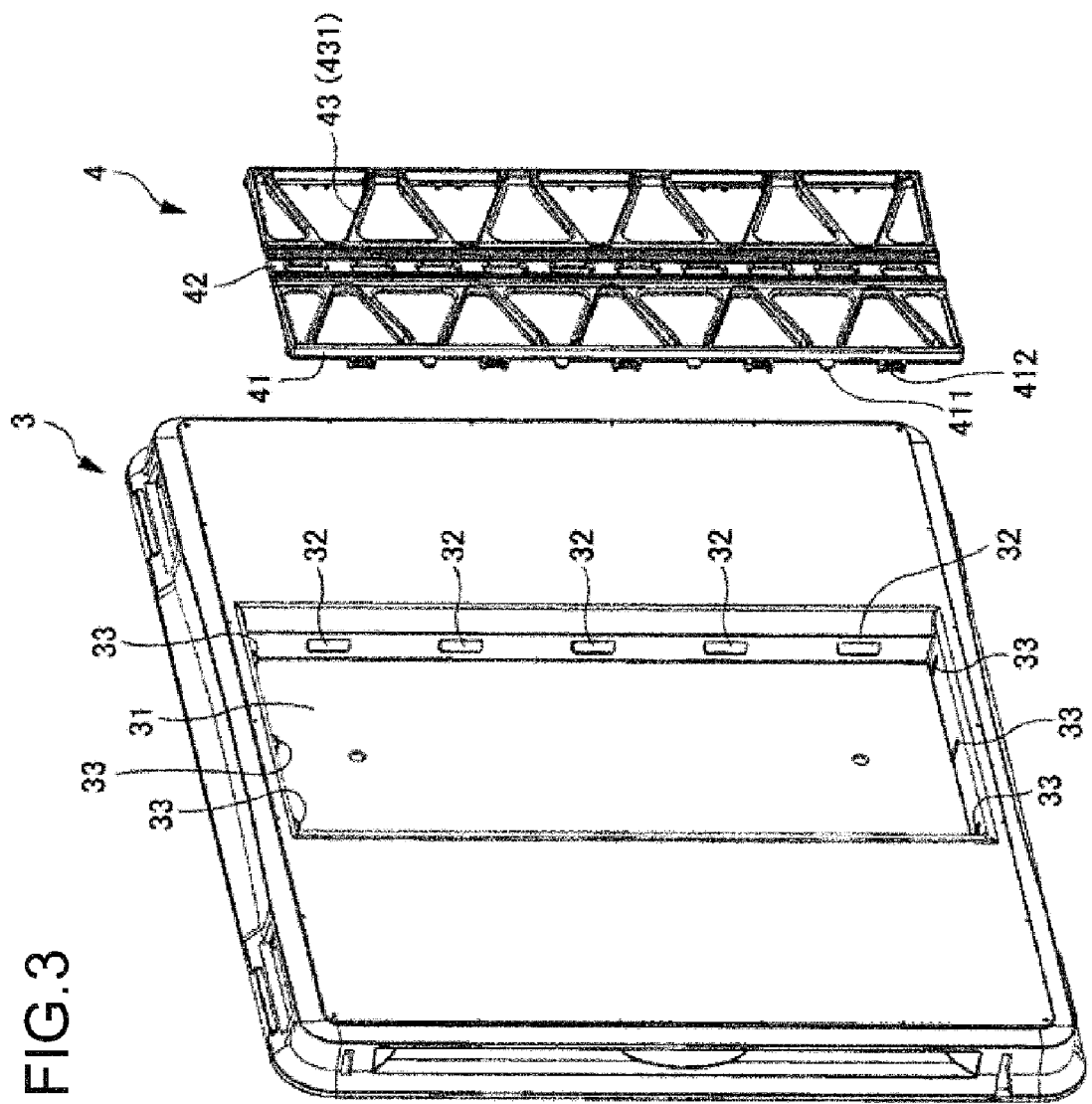
FIG. 3 is an exploded perspective view of a lid and a retainer.
Figure 4:
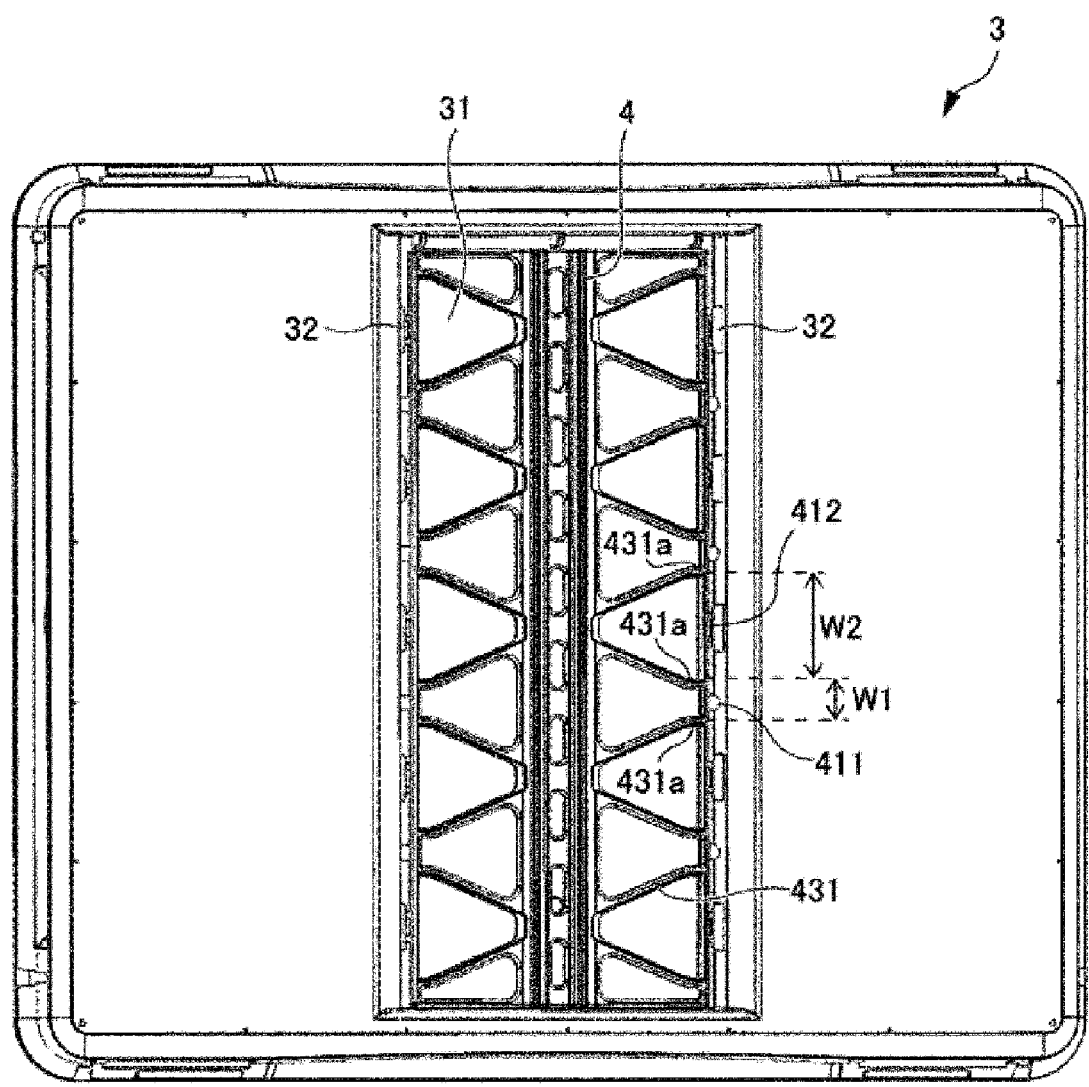
FIG. 4 is a perspective view of the lid and the retainer attached to the lid.
Figure 5A:
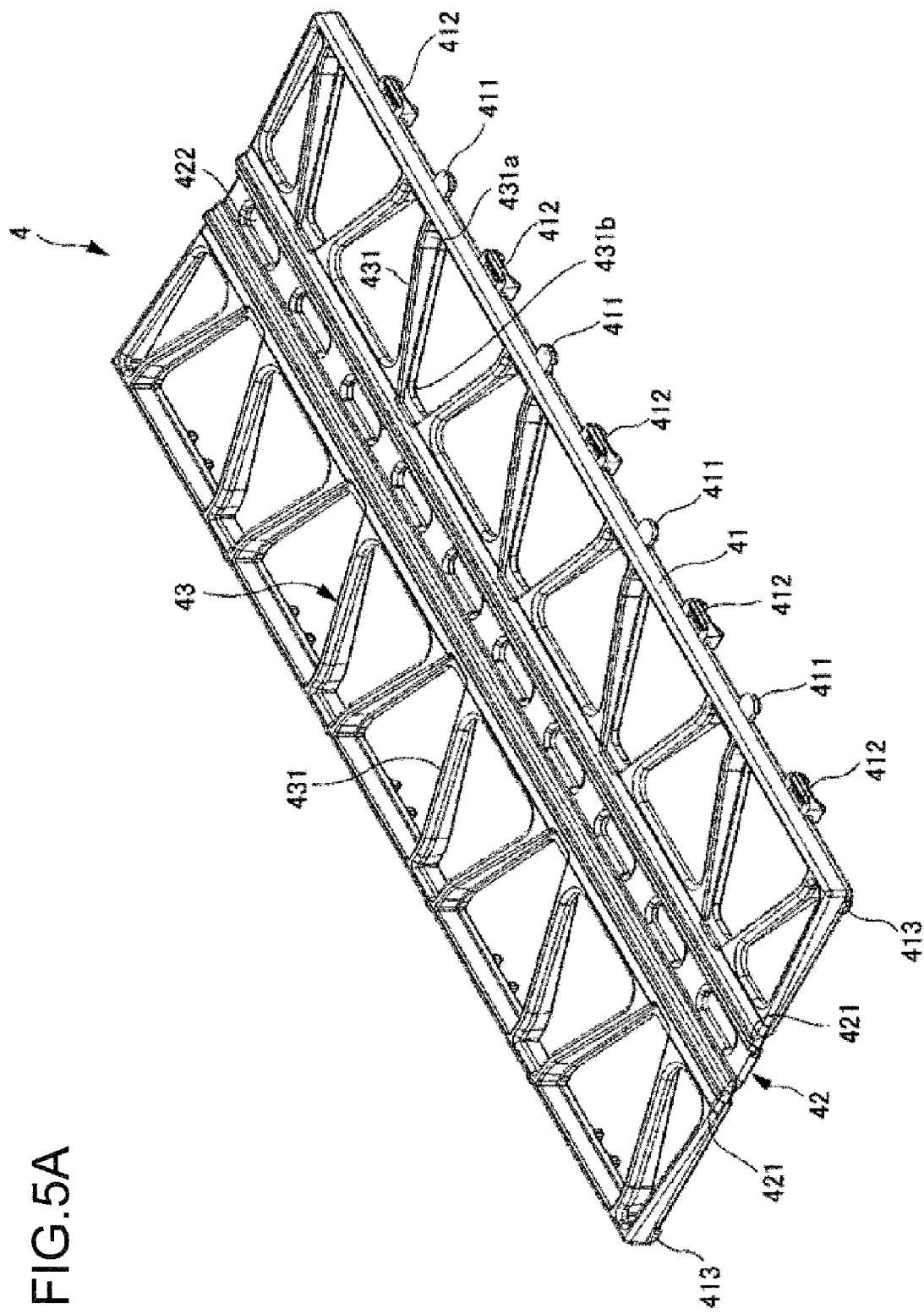
FIG. 5A is a perspective view of the retainer.
Figure 5B:
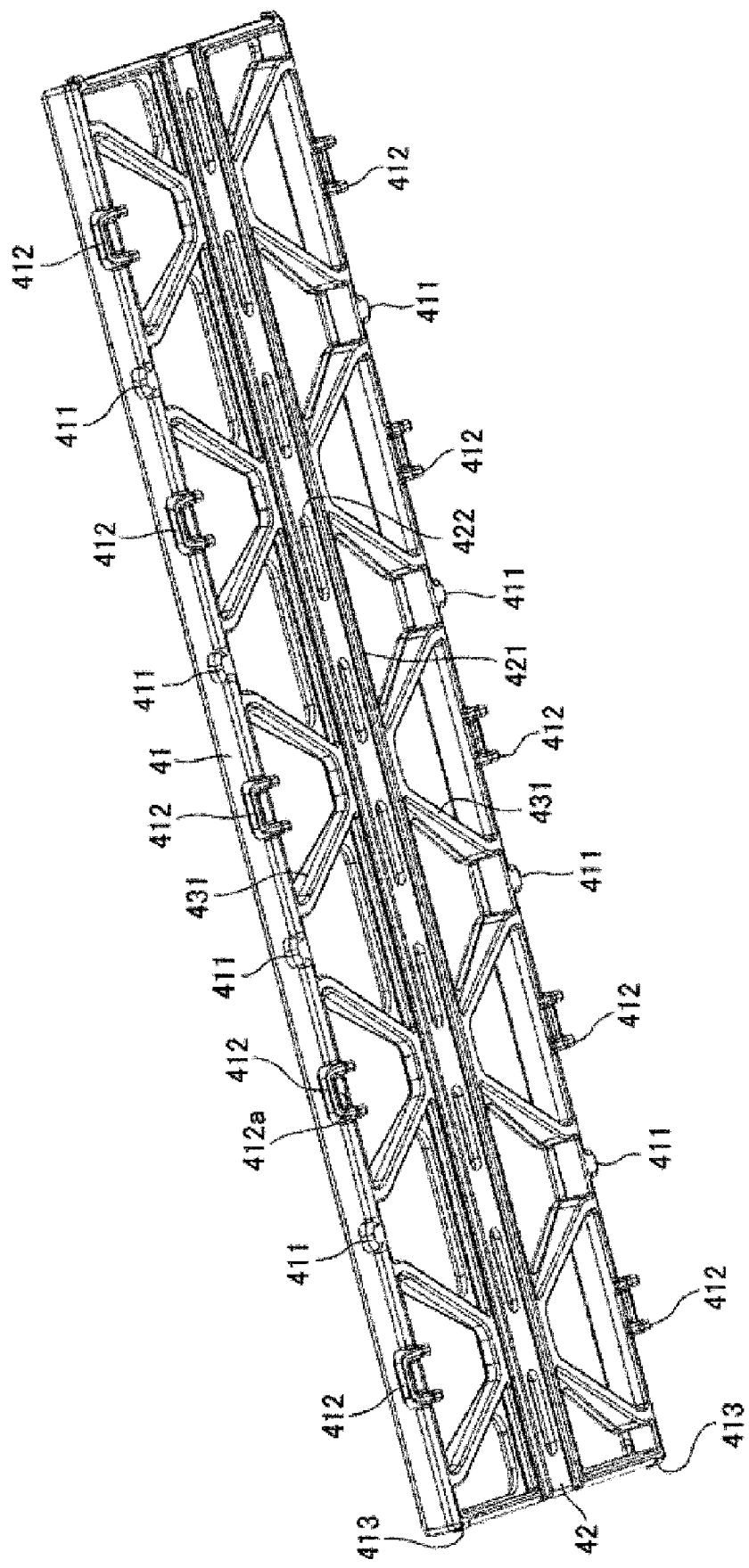
FIG. 5B is a perspective view of the retainer.

FIG. 3 is an exploded perspective view of the lid 3 and a retainer 4. FIG. 4 is a perspective view of the lid 3 and the retainer 4 attached to the lid 3. FIGS. 5A to 5C are perspective views of the retainer 4.

As illustrated in FIGS. 3 and 4, the retainer 4 is configured to be removably fitted in a recess 31 formed in the back of the lid 3.

The lid 3 is provided with five pairs of left and right engagement portions 32 and three pairs of upper and lower engagement portions 33, which are formed in the recess 31, for the attachment of the retainer 4 (FIG. 3 illustrates only the right engagement portions 32).

As illustrated in FIGS. 3, 4, and 5A to 5C, the retainer 4 is formed by the integration of a frame 41, a contact portion 42, and a beam structure 43 that connects the frame 41 and the contact portion 42. The frame 41 is configured to be detachably attached to the back of the lid 3 (the recess 31). The contact portion 42 includes a pair of convex portions 421 configured to contact the substrates 10 and restrict them from moving to the front side. When the retainer 4 is attached to the lid 3, the contact portion 42 and the beam structure 43 are spaced apart rearwardly (toward the rear face) from the lid 3.

The frame 41 is formed in a shape of a rectangle that surrounds the contact portion 42, and constitutes the outer peripheral portion of the retainer 4.

The frame 41 includes four pairs of left and right positioning portions 411 and five pairs of left and right engagement portions 412, which are arranged in the longitudinal direction on the left and right edges. The frame 41 further includes two pairs of upper and lower positioning portions 413, which are formed on the upper and lower edges.

Examples of material(s) for molding the retainer 4 include synthetic resins such as polypropylene, polycarbonate, polyethylene terephthalate, polybutylene terephthalate, polyether ether ketone, polyacetal, and polyetherimide, polyester thermoplastic elastomers, and polyurethane thermoplastic elastomers. The use of polypropylene is particularly preferable for its high flexibility and firmness. An antistatic agent, a conductivity-imparting agent such as carbon or metal fiber, an ultraviolet absorber, and a reinforcing agent such as glass fiber or carbon fiber are selectively added to the molding material in an appropriate amount.

Figure 6A:
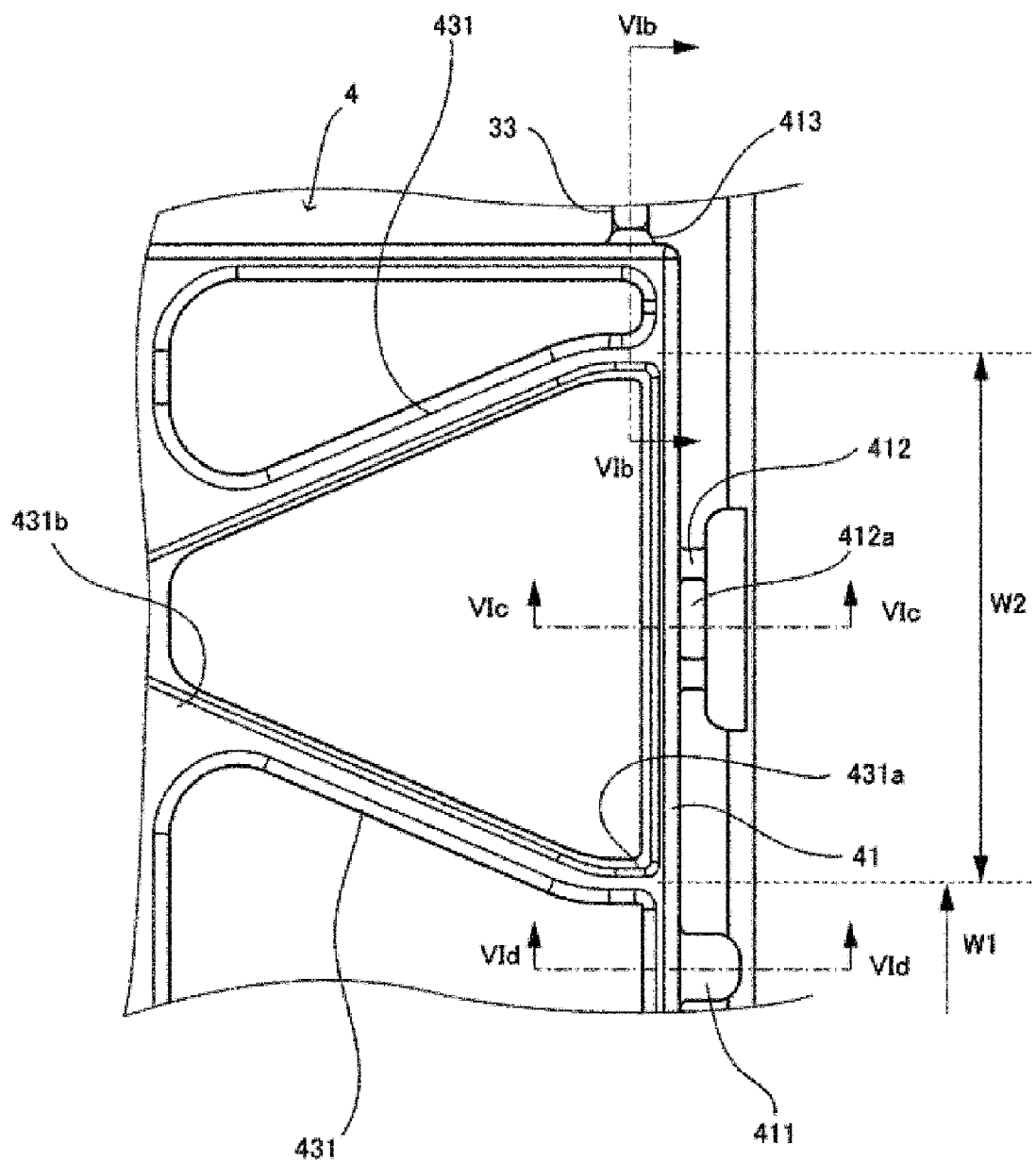
FIG. 6A is an enlarged rear view of a part of the retainer.
Figure 6B:
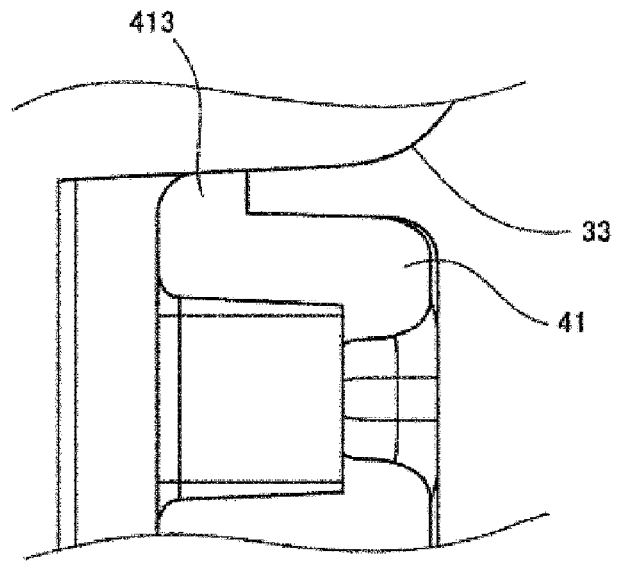
FIG. 6B is a cross-sectional view taken along line VIb-VIb of FIG. 6A.
Figure 6C:
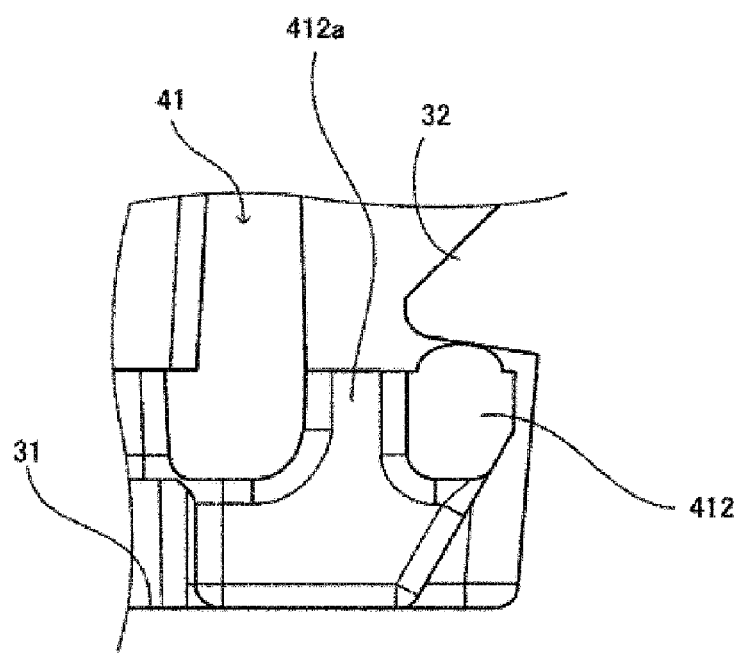
FIG. 6C is a cross-sectional view taken along line VIc-VIc of FIG. 6A.
Figure 6D:
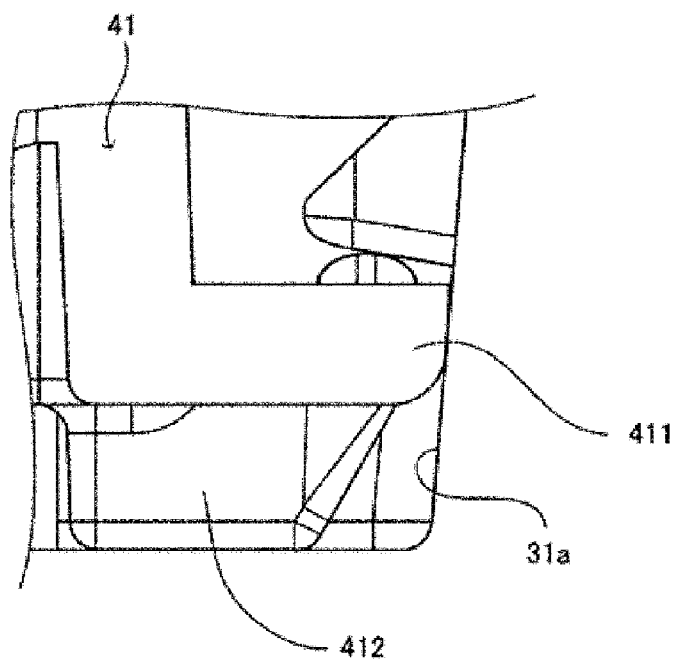
FIG. 6D is a cross-sectional view taken along line VId-VId of FIG. 6A.

FIG. 6A is an enlarged rear view of a part of the retainer 4. FIG. 6B is a cross-sectional view taken along line VIb-VIb of FIG. 6A. FIG. 6C is a cross-sectional view taken along line VIc-VIc of FIG. 6A. FIG. 6D is a cross-sectional view taken along line VId-VId of FIG. 6A.

As illustrated in FIG. 6B, the positioning portions 413 formed on the upper and lower edges of the retainer 4 each come in contact with a corresponding one of the engagement portions 33 of the lid 3, thereby regulating the position of the frame 41 of the retainer 4 relative to the lid 3 in the longitudinal direction (the vertical direction in FIG. 6A).

As illustrated in FIG. 6C, the engagement portions 412 formed on the left and right edges of the retainer 4 each come in contact with a corresponding one of the engagement portions 32 of the lid 3, and are positioned between the bottom of the recess 31 and the engagement portions 32. Thus, the position of the frame 41 is regulated in the front-rear direction (the vertical direction in FIG. 6C).

As illustrated in FIG. 6D, the positioning portions 411 formed on the left and right edges of the retainer 4 come in contact with a side surface 31a (FIG. 6D illustrates the right side surface) of the recess 31 of the lid 3, thereby regulating the position of the frame 41 relative to the lid 3 in the lateral direction (the horizontal direction in FIGS. 6A and 6D).

As illustrated in FIGS. 5B, 6A and 6C, each of the engagement portions 412 has a hole 412a that penetrates therethrough in the front-rear direction (the vertical direction in FIG. 6C). The hole 412a has a function to facilitate the removal of a cleaning liquid (water) adhering to the area around the engagement portion 412. For example, in the process of blowing off adhering water with an air gun, the remaining water can be easily removed from the frame 41 including the engagement portions 412 as well as from the recess 31 of the lid 3.

As illustrated in FIGS. 5A to 5C, the contact portion 42 of the retainer 4 extends in the longitudinal direction (see FIGS. 1 and 2). The contact portion 42 includes the left and right convex portions 421 that extend in the longitudinal direction. The substrates 10 are restricted from moving toward the front side through the contact of their ends with the top parts of the convex portions 421. The top parts of the convex portions 421 extend linearly in the longitudinal direction, which allows them to be stably in contact with the substrates 10 regardless of the vertical positional relationship between the substrates 10 and the contact portion 42. Thereby, the movement of the substrates 10 can be stably restricted.

The contact portion 42 further includes 10 holes 422 that are arranged in the longitudinal direction between the left and right convex portions 421. Each of the holes 422 penetrates the contact portion 42 in the front-rear direction (the direction perpendicular to the plane of FIG. 6A) and has a function to facilitate the removal of a cleaning liquid (water) adhering to the contact portion 42 and the lid 3. For example, in the process of blowing off adhering water with an air gun, the remaining water can be easily removed.

As illustrated in FIGS. 5A to 5C and 6A, the beam structure 43 includes 10 pairs of left and right beams 431 bridged between the frame 41 and the contact portion 42. The beams 431 each include a base end 431a connected to the frame 41 and a distal end 431b connected to the contact portion 42, and support the contact portion 42 with respect to the frame 41 (FIGS. 5A and 6A). The beams 431 each extend in a direction at an angle to the horizontal direction. Specifically, the beams 431 alternately extend in different directions such that longitudinally adjacent ones form an angle of about 60°. As a result, the frame 41 has first regions where the distance W1 between the base ends 431a of the adjacent beams 431 is small and second regions where the distance W2 between the base ends 431a of the adjacent beams 431 is relatively large, which are alternately formed in the longitudinal direction (FIGS. 4 and 6A).

In the frame 41, the positioning portions 411 are each formed in one of the first regions where the distance W1 between the base ends 431a is small, while the engagement portions 412 are each formed in one of the second regions where the distance W2 between the base ends 431a is relatively large.

Since the positioning portions 411 are formed in the first regions where the distance W1 between the base ends 431a is small, the frame 41 is less bent and deformed in the lateral direction in areas having the positioning portions 411. Because of this, when the positioning portions 411 are in contact with the lid 3, the frame 41 is relatively firmly fixed to the lid 3 in the lateral direction.

On the other hand, the engagement portions 412 are formed in the second regions where the distance W2 between the base ends 431a is relatively large. Accordingly, the frame 41 can be more bent and deformed in the lateral direction in areas having the engagement portions 412, which makes it easy to deform the frame 41 toward the center of the retainer 4. Further, since individual areas with the engagement portions 412 are bendable independently of one another in the frame 41, the engagement portions 412 can be easily engaged with the lid 3 by bending an area corresponding to each of the engagement portions 412 toward the center of the retainer 4 in the process of attaching the retainer 4 to the lid 3.

Furthermore, when the retainer 4 is misaligned with respect to the lid 3 due to a force applied to the retainer 4, the frame 41 is deformed in areas around the engagement portions 412 to absorb the misalignment. In addition, individual areas around the engagement portions 412 can be deformed independently of one another in the frame 41, and they are uniformly deformable. Therefore, if the retainer 4 is misaligned with respect to the lid 3, the areas of the frame 41 around the engagement portions 412 are each deformed by a required amount to maintain the engagement with the lid 3. This reduces the risk of the retainer 4 coming off the lid 3.

The strength of the engagement provided by each of the engagement portions 412 can be adjusted independently by changing the shape of the individual engagement portions 412 or the shape of their respective counterpart engagement portions 32 of the lid 3.

In the retainer 4, the contact portion 42 extending in the longitudinal direction is supported by the beams 431 arranged in the longitudinal direction. The beams 431 are deformed substantially uniformly in response to a force applied to the contact portion 42 in the front-rear direction. Hence, the entire beam structure 43 is bent evenly when the contact portion 42 is subjected to an impact or the like, thereby securely absorbing the impact. For example, when a force is applied to the contact portion 42 in the P direction (front-rear direction) in FIG. 5C, the beams 431 bend all together such that the contact portion 42 moves in the P direction, which reduces the concentration of stress at a specific part. This lowers the risk of the retainer 4 coming off the lid 3 due to the impact caused by, for example, dropping the substrate storage container 1.

Meanwhile, the beam structure 43 has the required strength in the direction along the lid 3 (in-plane direction) through the combination of the beams 431 as with the truss structure.

As mentioned above, when the retainer 4 is attached to the lid 3, the contact portion 42 and the beam structure 43 are spaced apart rearwardly from the lid 3. Specifically, in a state where front surfaces 412b (FIG. 5C) of the engagement portions 412 are in contact with the recess 31 of the lid 3, the contact portion 42 and the beam structure 43 are spaced apart rearwardly from the recess 31. Consequently, if the contact portion 42 moves in the front-rear direction (the P direction in FIG. 5C) due to the bending of the beam structure 43, the contact portion 42 and the beam structure 43 do not come into contact with the recess 31 of the lid 3. Thus, the retainer 4 is prevented from falling off due to accidental contact with the lid 3.

Figure 7:
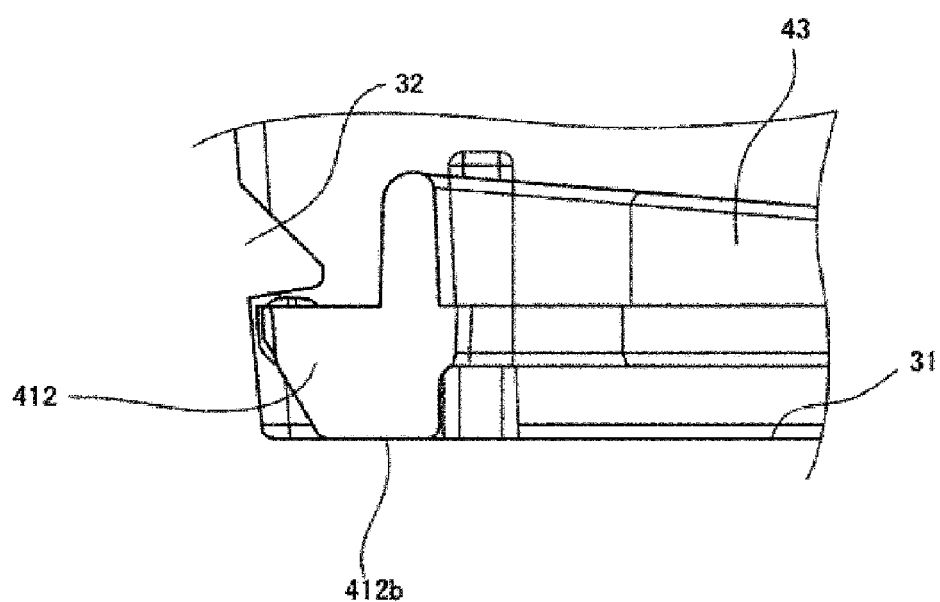
FIG. 7 is a horizontal cross-sectional view of an engagement portion with its front surface in contact with a recess of the lid.

FIG. 7 is a horizontal cross-sectional view of the engagement portion 412 with the front surface 412b (FIG. 5C) in contact with the recess 31 of the lid 3.

As illustrated in FIG. 7, when the front surfaces 412b (FIG. 5C) of the engagement portions 412 are in contact with the recess 31 of the lid 3, the beam structure 43 is located spaced apart from the recess 31; similarly, the contact portion 42 (not illustrated in FIG. 7) is located spaced apart from the recess 31. In this manner, the retainer 4 contacts the surface of the lid 3 only through the front surfaces 412b of the engagement portions 412, which reduces the contact area. This provides a function to facilitate the removal of a cleaning liquid (water) adhering to the area around the engagement portions 412. For example, in the process of blowing off adhering water with an air gun, the remaining water can be easily removed from the engagement portions 412 and the lid 3 (the recess 31).

In this embodiment, the convex portions 421 are formed integrally with the contact portion 42 as a part thereof; however, the convex portion(s) 421 may be formed of a separate member. In this case, for example, a concave portion to which the convex portion 421 can be detachably attached is formed in a position corresponding to the contact portion 42, and the convex portion 421 is attached by fitting it in the concave portion. Additionally, in this case, the height of the convex portion 421 can be changed according to the application by preparing convex portions with different heights (sizes in the front-rear direction). With this, the retainer 4 (except the convex portion) can be commonly used for a variety of applications.

Figure 8B:
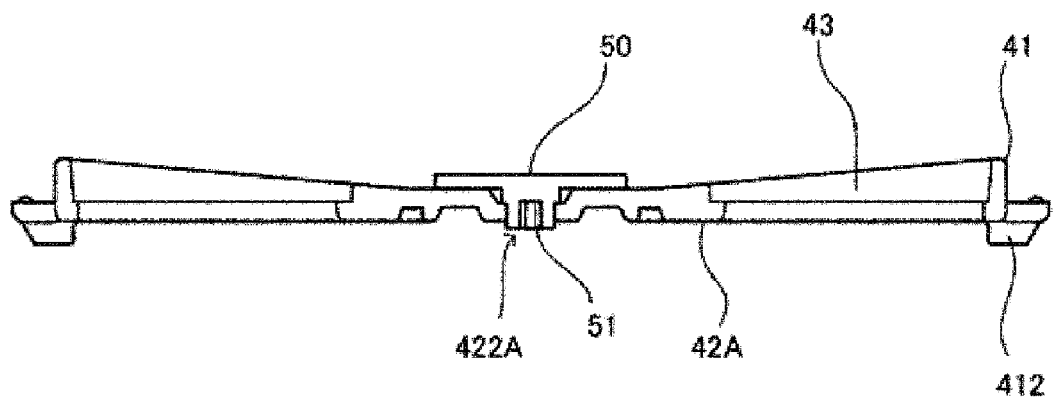
FIG. 8B is a horizontal cross-sectional view illustrating an example in which the detachable separate member is attached to the contact portion.

Another separate member may also be detachably attached to the contact portion (42). FIG. 8A is a perspective view illustrating an example in which a detachable separate member is attached to a contact portion 42A. FIG. 8B is a horizontal cross-sectional view illustrating an example in which the detachable separate member is attached to the contact portion 42A.

In the example illustrated in FIGS. 8A and 8B, a separate member 50, which is a plate-shaped elastic member extending in the longitudinal direction, is attached to the contact portion 42A. The substrates 10 are restricted from moving to the front side through the contact of their ends with the separate member 50.

The contact portion 42A is provided with holes 422A (FIG. 8B) similar to the holes 422, while the separate member 50 has claws 51 (FIG. 8B), which are each fitted or press-fitted into a corresponding one of the holes 422A to attach the separate member 50 to the contact portion 42A.

In this manner, by using detachable members such as the separate member 50, different types of separate members can be attached to the same retainer to meet a variety of applications and requirements.

Figure 9:
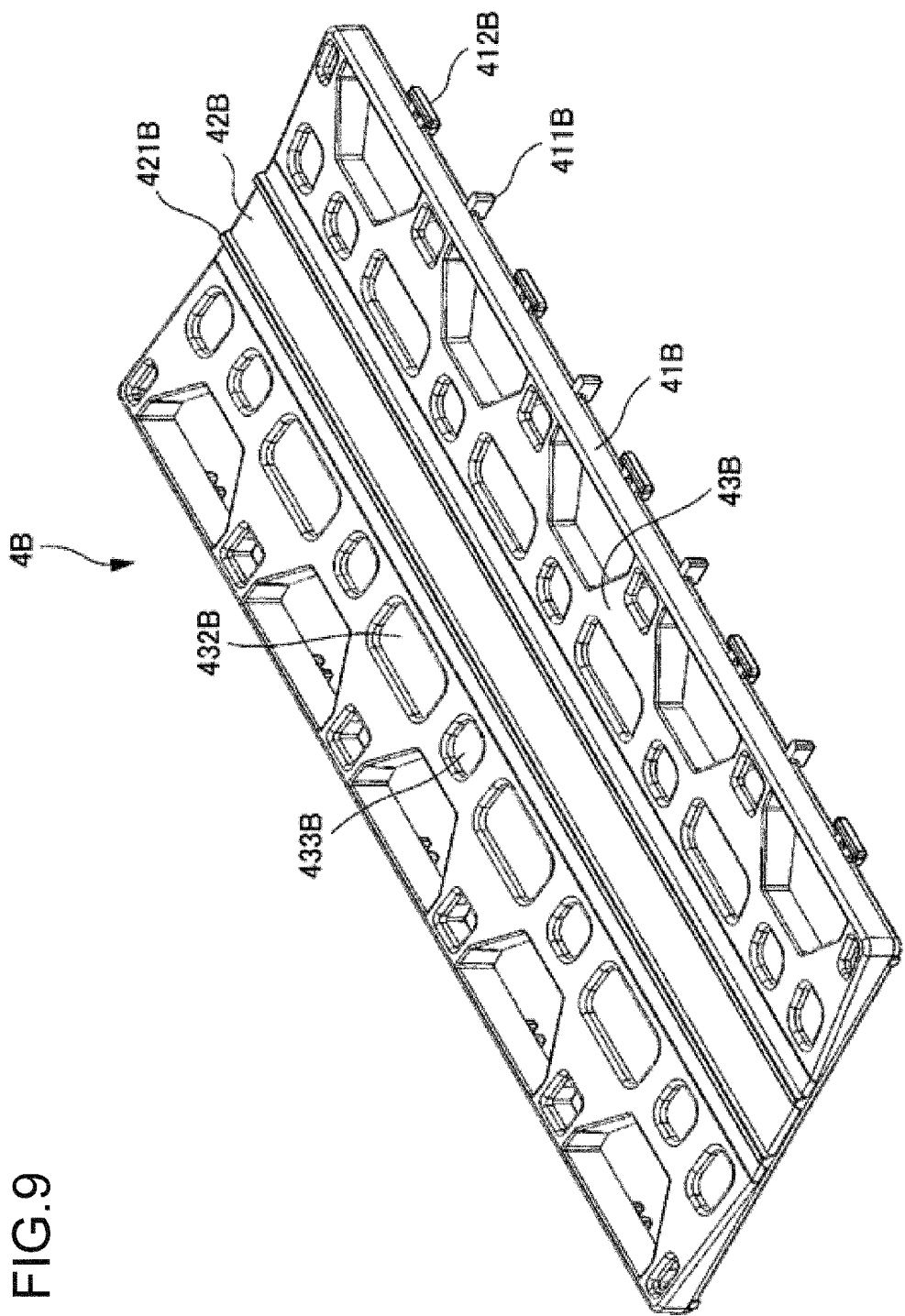
FIG. 9 is a perspective view illustrating an example of a retainer with improved moldability.

FIG. 9 is a perspective view illustrating an example of a retainer 4B with improved moldability.

The retainer 4B is formed with a uniform or substantially uniform thickness throughout. For this reason, injection molding can be performed with excellent moldability in the manufacture of the retainer 4B, which improves the yield and also contributes to the longevity of the mold. The retainer 4B is formed by the integration of a frame 41B, a contact portion 42B, and a beam structure 43B that connects the frame 41B and the contact portion 42B. The frame 41B is configured to be detachably attached to the back of the lid 3. The contact portion 42B includes a convex portion 421B configured to contact the substrates 10 and restrict them from moving to the front side. The contact portion 42B and the beam structure 43B are configured to be spaced apart rearwardly from the lid 3.

The frame 41B includes positioning portions 411B (corresponding to the positioning portions 411 of the retainer 4) and engagement portions 412B (corresponding to the engagement portions 412 of the retainer 4).

As compare to the retainer 4, the retainer 4B is characterized in particular in that the beam structure 43B is thicker in the front-rear direction (see FIG. 9) and has a larger volume, resulting in an increased rigidity of the beam structure 43B. The beam structure 43B has holes 432B and holes 433B that penetrate therethrough in the front-rear direction. These holes reduce the weight of the retainer 4B and also have a function to facilitate the removal of a cleaning liquid (water) adhering to the contact portion 42B and the lid 3.

Figure 10:
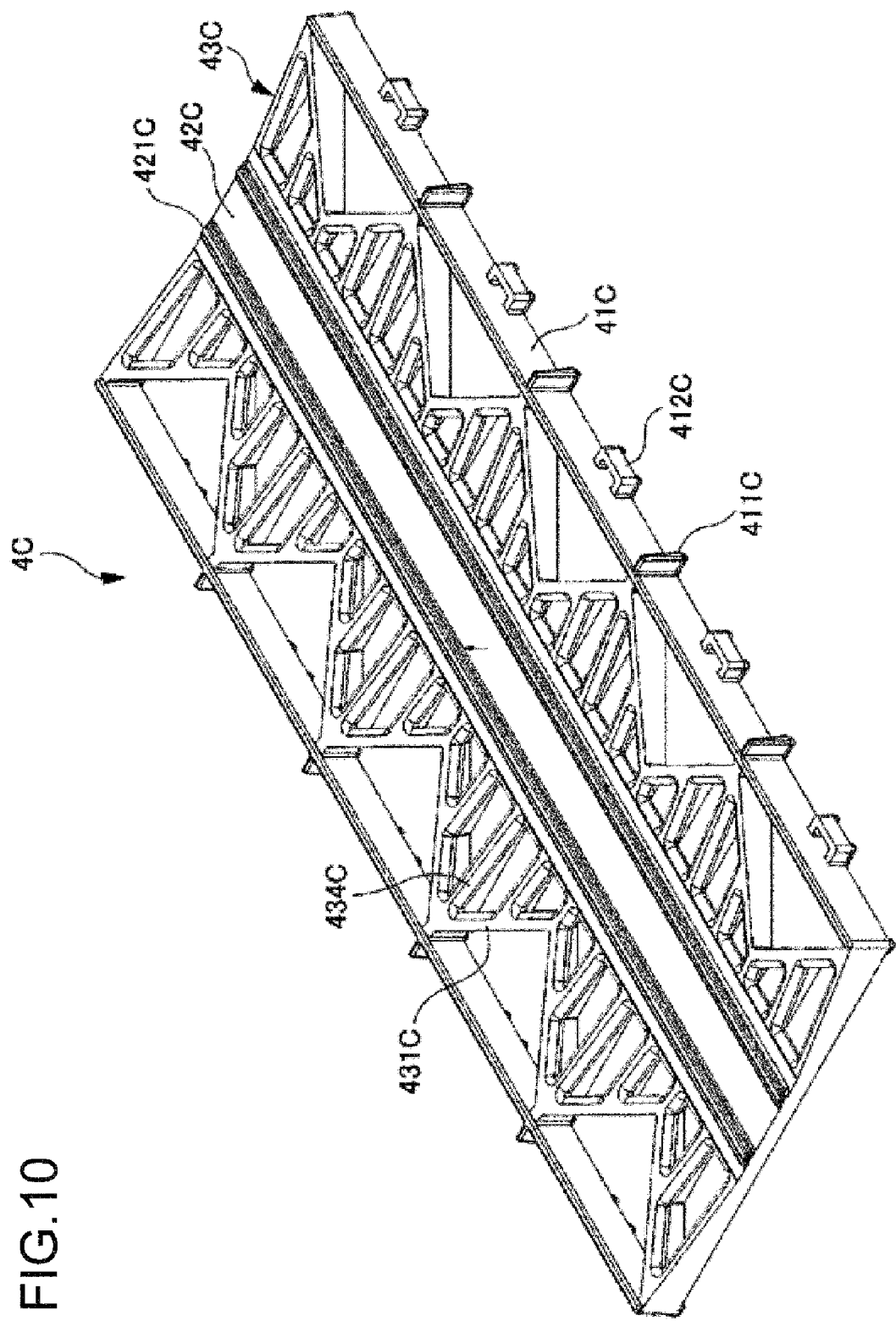
FIG. 10 is a perspective view illustrating an example of a retainer in which the bending direction is restricted.

FIG. 10 is a perspective view illustrating an example of a retainer 4C in which the bending direction is restricted.

The retainer 4C is formed by the integration of a frame 41C, a contact portion 42C, and a beam structure 43C that connects the frame 41C and the contact portion 42C. The frame 41C is configured to be detachably attached to the back of the lid 3. The contact portion 42C includes a convex portion 421C configured to contact the substrates 10 and restrict them from moving to the front side. The contact portion 42C and the beam structure 43C are configured to be spaced apart rearwardly from the lid 3.

The frame 41C includes positioning portions 411C (corresponding to the positioning portions 411 of the retainer 4) and engagement portions 412C (corresponding to the engagement portions 412 of the retainer 4). The beam structure 43C includes beams 431C similar to the beams 431 of the retainer 4.

The retainer 4C is formed such that the frame 41C is thicker in the front-rear direction (see FIG. 10) than the frame 41. This reduces the deformation of the retainer 4C in the direction in which the frame 41C is distorted especially in the left and right linear edges extending in the longitudinal direction.

The beam structure 43C further include beams 434C that connect the beams 431C to the contact portion 42C. While allowing the retainer 4C to bend such that the contact portion 42C moves in the front-rear direction (see FIG. 10) with respect to the positioning portions 411C or the engagement portions 412C, the beams 434C suppress the retainer 4C from deforming in other directions, for example, from laterally expanding or contracting, since they extend horizontally. Furthermore, because of the plurality of beams 434C extending horizontally from the beams 431C, the contact portion 42C is bent evenly in the longitudinal direction when the lid 3 is closed as compared to the retainer 4, 4B of the above embodiments. As a result, variations in holding force for the substrates 10 can be reduced.

Although specific embodiments of the invention have been described and illustrated, it is to be understood that the invention is not to be limited to the embodiments disclosed herein. As would be apparent to those skilled in the art, various changes, modifications, and alterations may be made within the scope of the invention as defined in the appended claims.

LIST OF REFERENCE SIGNS

1 Substrate storage container
2 Container body
3 Lid
4, 4B, 4C Retainer
41, 41B, 41C Frame
42, 42B, 42C Contact portion
43, 43B, 43C Beam structure
411, 411B, 411C Positioning portion
412, 412B, 412C Engagement portion
421, 421B, 421C Convex portion
431, 431C Beam

The invention claimed is:

1. A substrate storage container, comprising:
   a container body configured to store a substrate;
   a lid configured to close an opening formed on a front side of the container body; and
   a retainer arranged on a back of the lid and configured to restrict the substrate from moving to the front side,
   wherein the retainer comprises an integration of:
      a frame configured to be detachably attached to the back of the lid;
      a contact portion comprising a convex portion that extends linearly in a longitudinal direction and is configured to contact the substrate and restrict the substrate from moving to the front side; and
      a beam structure that connects the frame and the contact portion, and
   wherein the contact portion and the beam structure are configured to be spaced apart from the lid.

2. The substrate storage container according to claim 1, wherein
   the contact portion extends vertically,
   the beam structure comprises a plurality of beams arranged in the longitudinal direction, each having a base end connected to the frame and a distal end connected to the contact portion, the beams each extend in a direction at an angle to a horizontal direction, and longitudinally adjacent beams extend in different directions.

3. The substrate storage container according to claim 2, wherein the frame has a plurality of positioning portions arranged in the longitudinal direction, the frame comprises a first region where a distance between base ends of adjacent beams is small and a second region where a distance between the base ends of the adjacent beams is larger than that in the first region, each of the positioning portions is located in the first region, and the positioning portions are each engaged with the lid, which regulates a position of the frame relative to the lid in a lateral direction.

4. The substrate storage container according to claim 2, wherein the frame has a plurality of engagement portions arranged in the longitudinal direction, the frame comprises a first region where a distance between base ends of the adjacent beams is small and a second region where a distance between the base ends of the adjacent beams is larger than that in the first region, each of the engagement portions is located in the second region, and the engagement portions are each engaged with the lid, which regulates a position of the frame relative to the lid in a front-rear direction.

5. The substrate storage container according to claim 4, wherein the engagement portions each comprise a hole that penetrates therethrough in the front-rear direction.

6. The substrate storage container according to claim 1, wherein the contact portion comprises a hole that penetrates therethrough in a front-rear direction.

7. The substrate storage container according to claim 1, further comprising an elastic separate member configured to be attached to the contact portion.

* * * * *